United States Patent [19]

Fukuchi et al.

[11] Patent Number: 5,193,668

[45] Date of Patent: Mar. 16, 1993

[54] TOUCH-SENSITIVE PANEL AND DISPLAY APPARATUS USING THE TOUCH-SENSITIVE PANEL

[75] Inventors: Shunsei Fukuchi, Nara; Nobuhiro Kasai, Yamato-Koriyama, both of Japan

[73] Assignee: Sharp Kabushiki Kaisha, Osaka, Japan

[21] Appl. No.: 689,648

[22] Filed: Apr. 22, 1991

[30] Foreign Application Priority Data

Apr. 28, 1990 [JP] Japan .................................. 2-113073

[51] Int. Cl.⁵ .......................................... H01H 13/52
[52] U.S. Cl. .................................. 200/512; 200/5 A;
200/292; 29/622; 439/91; 439/86
[58] Field of Search ............... 200/512, 314, 514, 517,
200/5 A, 511, 292; 439/66, 91, 86, 591; 29/622,
876, 825, 842

[56] References Cited

U.S. PATENT DOCUMENTS

| | | | |
|---|---|---|---|
| 4,008,300 | 2/1977 | Ponn | 439/91 X |
| 4,050,756 | 9/1977 | Moore | 200/511 X |
| 4,064,623 | 12/1977 | Moore | 439/86 X |
| 4,066,852 | 1/1978 | Zenk | 200/5 A |
| 4,066,853 | 1/1978 | Zenk | 200/5 A |
| 4,066,854 | 1/1978 | Zenk et al. | 200/5 A |
| 4,221,444 | 9/1980 | Patrick | 439/91 |
| 4,240,198 | 12/1980 | Alonso | 439/91 X |
| 4,423,299 | 12/1983 | Gurol et al. | 200/512 |
| 4,427,861 | 1/1984 | Stillie | 200/512 |
| 4,431,882 | 2/1984 | Frame | 200/5 A |
| 4,467,151 | 8/1984 | Johnson et al. | 200/5 A |
| 4,509,099 | 4/1985 | Takamatsu et al. | 439/66 X |
| 4,598,472 | 7/1986 | Schlunz et al. | 200/512 X |
| 4,700,025 | 10/1987 | Hatayama et al. | 200/5 A |
| 5,001,308 | 3/1991 | Mori | 200/5 A |

FOREIGN PATENT DOCUMENTS

| | | | |
|---|---|---|---|
| 3603408 | 8/1987 | Fed. Rep. of Germany | 200/512 |
| 60-168128 | 11/1985 | Japan . | |
| 60-168129 | 11/1985 | Japan . | |
| 62-61216 | 3/1987 | Japan . | |
| 0226036 | 9/1988 | Japan | 439/91 |

Primary Examiner—Ernest G. Cusick
Attorney, Agent, or Firm—David G. Conlin; Ernest V. Linek

[57] ABSTRACT

A touch-sensitive panel for outputting data corresponding to pressed positions on a touching plate included in the touch-sensitive panel and for sending the output data to a display device includes a plurality of first electrodes arranged on the touching plate, a plurality of second electrodes being opposed to the plurality of first electrodes and being capable of conducting to the plurality of first electrodes located at the pressed positions when the touching plate is pressed, a first connecting plate for connecting the plurality of first electrodes to the display device, a second connecting plate for connecting the plurality of second electrodes to the display device, an anisotropic electrically conductive bonding layer having a plurality of through holes and arranged on the first connecting plate, and a conductive layer including conductive particles, the conductive layer being laid between the plurality of first electrodes and the anisotropic electrically conductive bonding layer, the conductive particles being in the through holes.

15 Claims, 3 Drawing Sheets

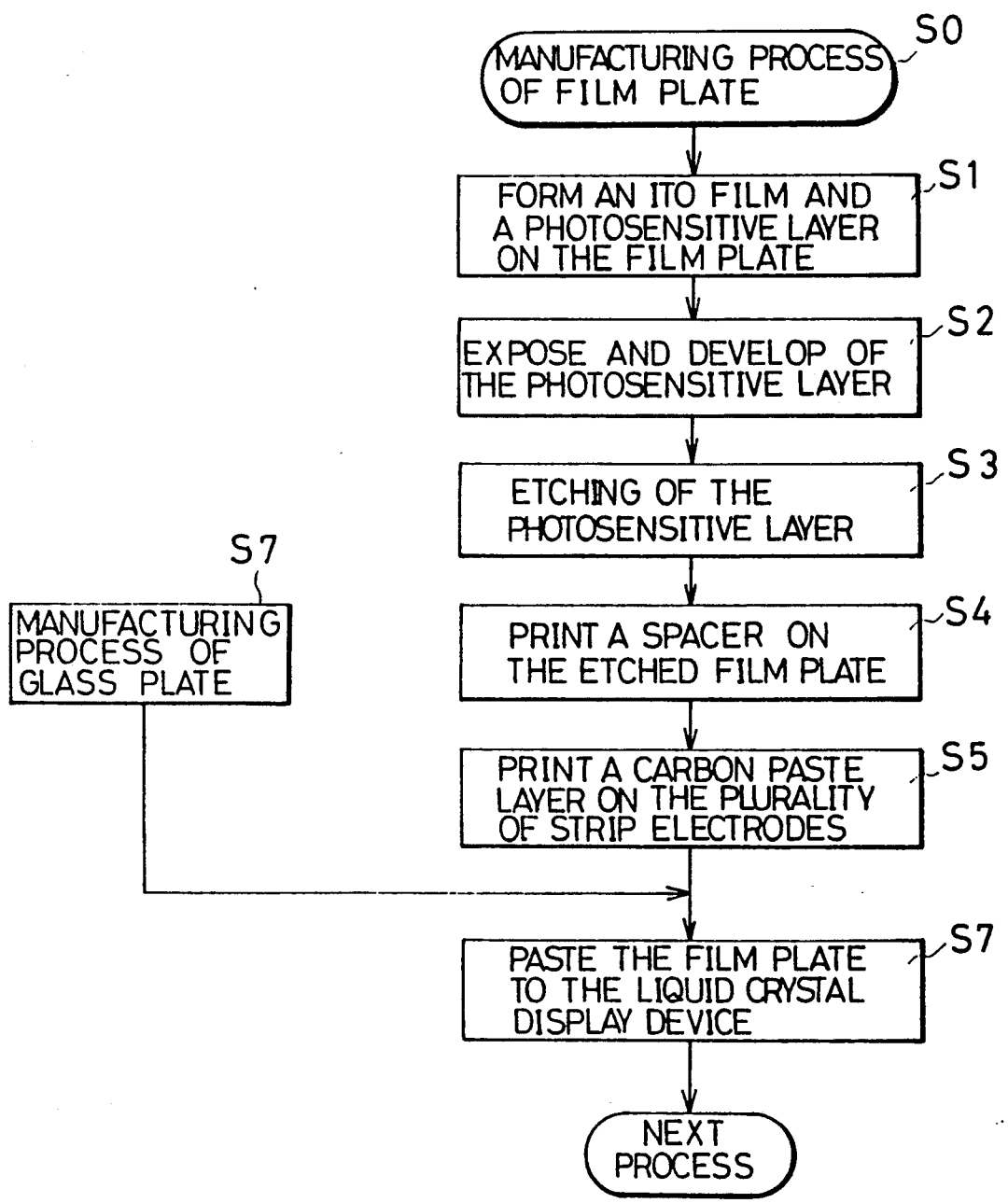

TOUCH-SENSITIVE PANEL AND DISPLAY APPARATUS USING THE TOUCH-SENSITIVE PANEL

BACKGROUND OF THE INVENTION

1. Field of the Invention

The present invention relates to a touch-sensitive panel for outputting data corresponding to positions where an operator presses his or her finger or the like, and a display apparatus using the touch-sensitive panel.

2. Description of the Related Art

The inventors of the present invention are aware of a previous display apparatus for displaying data which are input through a touch-sensitive panel.

The known display apparatus is composed of two main parts, that is, a liquid crystal display device and a touch-sensitive panel. The liquid crystal display device includes a pair of glass plates located in opposition to each other and a liquid crystal layer sealed by a sealing material. The liquid crystal layer is arranged between a pair of the glass plates. One of the glass plates, that is, a first glass plate, provides a plurality of row electrodes located on the opposed side to the other glass plate. The other glass plate, that is, a second glass plate, provides a plurality of column electrodes located on the opposed side to the first glass plate. That is, the row electrodes are opposed to the column electrodes. The row and column electrodes each consist of a transference conductive material. The touch-sensitive panel includes a plurality of first strip electrodes formed on the other side of the second glass plate, a connecting member composed of resin layers and a flexible wiring board located between the resin layers, and a plurality of second strip electrodes opposed to the first strip electrodes and formed on a film plate. The film plate is formed by a transference flexible resin material.

In operation, when an operator presses his or her finger or hand against the film plate of the touch-sensitive panel from the upper side, at the pressed location, the corresponding one of the second strip electrodes comes into contact with the opposed one of the first strip electrodes. By detecting the conducting state by means of the contact between both groups of the first and second strip electrodes, it is possible to specify the conducting electrodes. This results in the implementing of the input of the data represented at the location on the liquid crystal display device corresponds to the specified conducting electrodes. The connecting member is located between both of the first and second strip electrodes so that it serves to detect the conducting state. The connecting member is, as indicated above, composed of a flexible wiring board having on both sides circuit wiring electrically conducted to the first and second strip electrodes, and resin layers covered on both sides of the flexible wiring board. The resin layers provide a plurality of through holes and respectively serve as an anisotropic conductive bonding layer.

In order to fix and electrically connect the connecting member to the touch-sensitive panel, it is possible to take the steps of locating the connecting member in a connecting area between the second glass plate and the film plate, and apply pressure and heat to the film plate in the connecting area for melting down the resin layers. Since the resin layers provide a plurality of through holes, the flexible wiring plate is allowed to be electrically connected to both the second strip electrodes formed on the film plate and the first strip electrodes formed on the second glass plate through the resin layers.

Next, a manufacturing process of the touch-sensitive panel will be explained. In a first step, an ITO (Indium Tin Oxide) film and a photosensitive layer are formed on the overall surface of the film plate. The photosensitive layer serves to harden a portion of itself to which light is applied. In a second step, the photosensitive layer is exposed through a mask constructed for forming the second strip electrodes and is developed. At a third step, the etching treatment is carried out on the resulting photosensitive layer, and the second strip electrodes are formed from the ITO film coated on the overall surface of the film plate. In a fourth step, a spacer made of an epoxy resin, for example, is printed on the resulting surface of the film plate.

In a fifth step for the glass plate, the liquid crystal display device is formed so that the first strip electrodes are formed on the second glass plate by means of thin-film technology such as exposure and etching. In a sixth step, the liquid crystal display device having the first strip electrodes formed on the outer side (toward the side against which the operator presses his or her finger or the like) is pasted to the film plate formed in the fourth step. For performing the pasting step, it is possible to located the connecting member in the connecting area between the film plate and the second glass plate, and to apply pressure and heat to the film plate in the connecting area for melting down the resin layers. This results in allowing the first strip electrodes and the second strip electrodes to be respectively connected to the circuit wiring of the flexible wiring plate included in the connecting member as well as allowing the connecting member to be fixed to the second glass plate and the film plate.

The display apparatus, as described above, includes as one manufacturing step, the step of applying pressure and heat to the film plate in the connecting area for the purpose of connecting the connecting member to the touch-sensitive panel. This step can cause cracks in the second strip electrodes formed of a transference conductive material such as an ITO and having a thickness of 300 angstrom to 1000 angstrom, thereby lowering the reliability for inputting and displaying data. Such cracks may lead to the breakdown of the connecting line, which often causes failure to take place in the touch-sensitive panel, and hence, the overall display apparatus.

SUMMARY OF THE INVENTION

It is therefore an object of the present invention to provide a more reliable touch-sensitive panel which is capable of overcoming the foregoing technical shortcoming and preventing a defective state of electric conduction brough about in manufacturing the touch-sensitive panel.

The object of the invention can be achieved by a touch-sensitive panel for outputting data corresponding to pressed positions on a touching plate included in the touch-sensitive panel and for sending the output data to a display device, including:

a plurality of first electrodes arranged on the touching plate;

a plurality of second electrodes being opposed to the plurality of first electrodes and being capable of conducting to the plurality of first electrodes located at the pressed positions when the touching plate is pressed;

a first connecting plate for connecting the plurality of first electrodes to the display device;

a second connecting plate for connecting the plurality of second electrodes to the display device;

an anisotropic electrically conductive bonding layer having a plurality of through holes and arranged on the first connecting plate; and a conductive layer including conductive particles, the conductive layer being laid between the plurality of first electrodes and the anisotropic electrically conductive bonding layer, the conductive particles being in the through holes.

In operation, the touch-sensitive panel provides the pair of electrically insulating plates at least one of which is flexible and electrodes formed on each opposed surface of both plates. The connecting terminals connected to the contacts formed on the flexible plate are also connected to the connecting terminals connected to the contacts formed on the wiring board to be connected to the circuit outside of the touch-sensitive panel itself through the anisotropic conductive bonding layer. Hence, the conductive particles are laid between the connecting terminals formed on the contacts of the flexible plate and the anisotropic conductive bonding layer.

In case a crack or breakdown occurs in the connecting terminals when the connecting terminals are connected to the anisotropic conductive layer, the conductive particles fill in the gaps of the connecting terminals caused by the crack and/or the breakdown, thereby keeping the defective connecting terminals electrically conductive. This prevents the defective electric conduction caused in manufacturing the touch-sensitive panel, thereby greatly improving reliability.

Further objects and advantages of the present invention will be apparent from the following description of the preferred embodiments of the invention as illustrated in the accompanying drawings.

BRIEF DESCRIPTION OF THE DRAWINGS

FIG. 4 is a flowchart for illustrating one manufacturing process of the touch-sensitive panel.

DESCRIPTION OF THE PREFERRED EMBODIMENTS

Figure 2:
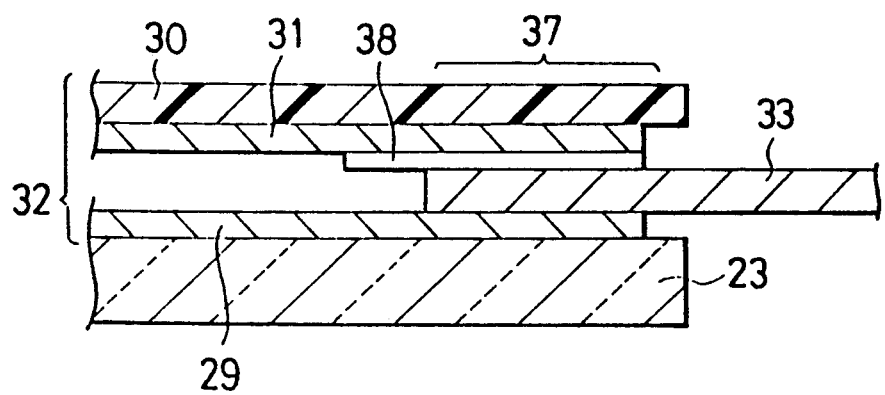
FIG. 2 is a simplified section showing the display apparatus.
Figure 3:
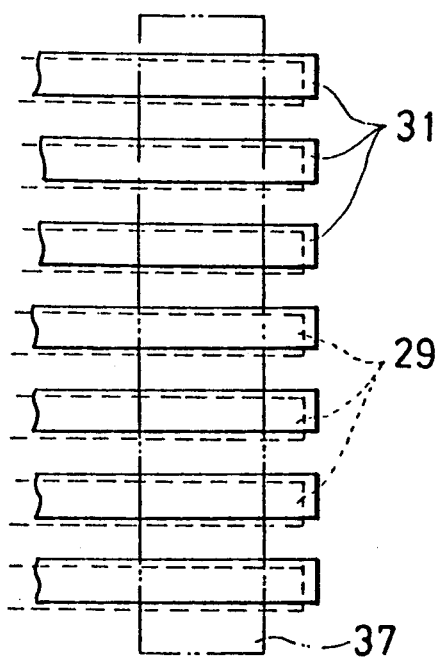
FIG. 3 is a plan view showing a connecting area of the touch-sensitive panel.

Hereinafter, the description will be directed to the touch-sensitive panel according to an embodiment of the present invention with reference to FIGS. 1 to 3.

Figure 1:
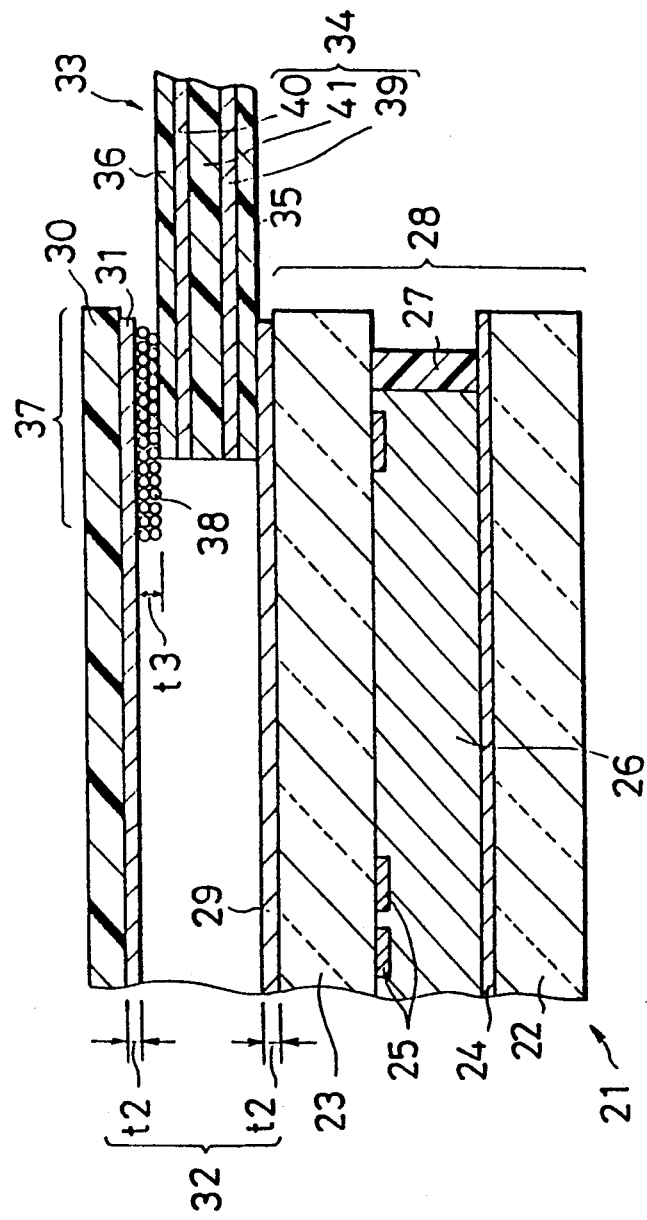
FIG. 1 is a sectional view showing a display apparatus including a touch-sensitive panel and a liquid crystal display device according to an embodiment of the present invention.

FIG. 1 is a sectional view showing a display apparatus 21 according to an embodiment of the present invention. FIG. 2 is a sectional view showing the simplified display apparatus 21. FIG. 3 is a plan view showing the display apparatus 21. Like the related art described above, the display apparatus 21 includes as main parts a liquid crystal display device 28 and a touch-sensitive panel 32.

First, the description will be directed to the liquid crystal display device 28. The liquid crystal device 28 provides a pair of glass plates 22, 23 located in opposition to each other. As shown, the glass plate 22 contains row electrodes 24 on the opposed surface to the glass plate 23. The glass plate 23 contains column electrodes 25 on the opposed surface to the glass plate 22. The row and column electrodes 24, 25 are formed by a transference conductive material such as an ITO. 26 denotes a liquid crystal layer injected between the pair of glass plates 22, 23 and sealed by a sealing member 27.

Next, the description will be directed to the touch-sensitive panel 32. The touch-sensitive panel 32 includes a plurality of strip electrodes 29, a film plate 30, a plurality of strip electrodes 31, and a carbon paste layer 38. The plurality of strip electrodes 29 are formed on the opposite side of the glass plate 23 to the one on which the column electrodes 25 are formed. The plurality of strip electrodes 29 are formed by a transference conductive material such as an ITO and has a thickness t2 (300 angstrom to 1000 angstrom). The film plate 30 is formed by a transference flexible resin material is located in opposition to the plurality of strip electrodes 29 and contains a plurality of strip electrodes 31 formed to have a thickness t2. The plurality of strip electrodes 31 are formed by a transference conductive material such as an ITO. The plurality of strip electrodes 31 provide a carbon paste layer 38 printed on the portion corresponding to a connecting area 37 of the plurality of strip electrodes 31. The carbon paste layer 38 is composed of a resin material in which carbon particles are dispersed.

When an operator presses his or her finger or the like against the touch-sensitive panel 32 from the upper side of the film plate 30 shown in FIG. 1, an electrode of the plurality of strip electrodes 31 located at the location corresponding to the pressed portion comes into contact with a corresponding electrode of the plurality of strip electrodes 29, that is, electrodes of the plurality of strip electrodes 29 and 31 electrically conduct each other at the pressed portion. By detecting this conducting state, it is possible to specify the conducting electrodes among the plurality of strip electrodes 29 and 31. This results in the implementing of the input of the data represented at the location on the liquid crystal display device 28 corresponding to the specified conducting electrodes.

To detect the conducting state in the touch-sensitive panel 32, as shown in FIG. 1, a connecting member 33 is laid between the plurality of strip electrodes 29 and 31. The connecting member 33 is composed of a flexible wiring board 34, melting layers formed on both sides of the flexible wiring board 34, and outer resin layers 35, 36 formed on the outer side of each melting layer. The flexible wiring board 34 consists of a supporting film 41 made of an electric insulating resin, and circuit wirings 39, 40 formed on both sides of the supporting film 41. The circuit wiring 39 is connected to the plurality of strip electrodes 29 and the circuit wiring 40 is connected to the plurality of strip electrodes 31. The outer resin layers 35, 36 provide a plurality of through holes through which the plurality of strip electrodes 29 and 31 are connected to the circuit wiring 39 and 40, respectively and in which conductive materials are filled. The outer resin layers 35, 36 are formed as an anisotropic conductive bonding layer.

In order to fix and electrically connect the connecting member 33 to the touch-sensitive panel 32, it is possible to take the steps of locating the connecting member 33 in a connecting area 37 between the glass plate 23 and the film plate 30 and applying pressure and heat to the film plate 30 in the connecting area 37 for melting down the outer resin layers 35, 36, resulting in realizing the connection.

Next, the description will be directed to the manufacturing process of the touch-sensitive panel 32 with reference to FIG. 4.

FIG. 4 is a flowchart for illustrating one manufacturing process of the touch-sensitive panel 32. After a step s0 for manufacturing process of the film plate 30, at a step s1, an ITO film and a photosensitive layer are formed on the overall surface of the film plate 30. The photosensitive layer serves to harden the portion of itself to which light is applied. At a step s2, the photosensitive layer is exposed and developed by using a mask constructed for forming the plurality of strip electrodes 31. At a step s3, the etching treatment is carried out on the photosensitive layer for forming the plurality of strip electrodes 31 on the ITO film formed on the overall surface of the film plate 30. At a step s4, a spacer made of an epoxy resin, for example, is printed on the etched film plate 30 with a thickness of 60 μm.

At a step s5, the carbon paste layer 38 is printed so as to coat the connecting area 37 on the plurality of strip electrodes 31 formed at the step s3. The carbon paste of the carbon paste layer 38 is formed of OCP-2340 (viscosity is about 3000 P.S (at temperature 25° C.)) made in Ohgi Chemical Industry Co., Ltd. and has a layer thickness t3 (shown in FIG. 1) of 5 μm to 20 μm.

In parallel to the manufacturing process of the touch-sensitive panel 32, at a step s6 for manufacturing a glass plate, the liquid crystal display device 28 is formed and then the plurality of strip electrodes 29 are formed on the glass plate 23 of the liquid crystal display device 28 by means of the thin-film technology such as exposure or etching. At a step s7, the liquid crystal display device 28 having the plurality of strip electrodes 29 formed thereon is pasted to the film plate 30 formed at the step s5. For pasting them, it is necessary to take the steps of locating the connecting member 33 in the connecting area 37 between the film plate 30 having the carbon paste layer 38 formed thereon and the glass plate 23 and, applying pressure and heat to the film plate 30 in the connecting area 37 from the upper side of the touch-sensitive panel 32 (see FIG. 1) for the purpose of melting the resin layers 35 and 36. This allows the circuit wiring 39 to be electrically connected to the plurality of strip electrodes 29 and the circuit wiring 40 to be electrically connected to the plurality of strip electrodes 31 as well as the connecting member 33 to be fixed on the glass plate 23 and the film plate 30.

Like the related art described above, the pressure and heat applied in pasting the touch-sensitive panel 32 to the liquid crystal display device 28 may cause crack or breakdown to take place in the plurality of strip electrodes 31. However, in the present invention the carbon particles contained in the carbon paste layer 38 will intrude into the cracked or the broken portions of the plurality of strip electrodes 31 so that these particles will fill in the defective portions. This results in keeping the defective strip electrodes 31 electrically conductive and the proper electrical connection between the plurality of strip electrodes 31 and the flexible wiring board 34, thereby improving the reliability of the touch-sensitive panel 32.

Many widely different embodiments of the present invention may be constructed without departing from the spirit and scope of the present invention. It should be understood that the present invention is not limited to the specific embodiments described in the specification, except as defined in the appended claims.

What is claimed is:

1. A touch-sensitive panel for outputting data corresponding to positions on a film plate where an operator presses his or her finger or the like, said film plate being included in said touch-sensitive panel and wherein said panel for sending said output data to a display device comprises:

a plurality of first electrodes arranged on said film plate;

a plurality of second electrodes being opposed to said plurality of first electrodes and being capable of conducting to said plurality of first electrodes located at said pressed positions when said film plate is pressed;

a first anisotropic electrically conductive bonding layer for connecting said plurality of first electrodes to said display device, said first anisotropic electrically conductive bonding layer having a plurality of through holes;

a second anisotropic electrically conductive bonding layer for connecting said plurality of second electrodes to said display device; and a conductive layer including conductive particles, said conductive layer being laid between said plurality of first electrodes and said first anisotropic electrically conductive bonding layer, said conductive particles being in said through holes.

2. A touch-sensitive panel according to claim 1, wherein said film plate is formed from a transference flexible electrically resin.

3. A touch-sensitive panel according to claim 1, wherein each of said plurality of first and second electrodes includes a strip-shaped electrode.

4. A touch-sensitive panel according to claim 3, wherein each of said plurality of first and second electrodes is made of a transference electrically conductive material and each is formed to have a thickness of from about 300 angstroms to 1000 angstroms.

5. A touch-sensitive panel according to claim 4, wherein said transference electrically conductive material for said plurality of first and second electrodes comprises Indium Tin Oxide.

6. A touch-sensitive panel according to claim 1, wherein said conductive particles are made of carbon particles.

7. A touch-sensitive panel according to claim 1, wherein said conductive layer is made of a layer having a viscosity of about 3000 P.S at temperature of 25° C. and is formed to have a thickness of from about 5 μm to 20 μm.

8. A display apparatus providing a touch-sensitive panel for outputting data corresponding to positions on a film plate where an operator presses his or her finger or the like, said film plate being included in said touch-sensitive panel which comprises:

a display device for displaying and output of data;

a plurality of first electrodes arranged on said film plate;

a plurality of second electrodes being opposed to said plurality of first electrodes and being capable of conducting to said plurality of first electrodes located at said pressed positions when said film plate is pressed;

a first anisotropic electrically conductive bonding layer for connecting said plurality of first electrodes to said display device, said first anisotropic electrically conductive bonding layer having a plurality of through holes;

a second anisotropic electrically conductive bonding layer for connecting said plurality of second electrodes to said display device; and a conductive layer including conductive particles, said conductive layer being laid between said plurality of first electrodes and said first anisotropic electrically conductive bonding layer, said conductive particles being in said through holes.

9. A display apparatus providing a touch-sensitive panel according to claim 8, wherein said film plate is formed from a transference flexible electrically resin.

10. A display apparatus providing a touch-sensitive panel according to claim 8, wherein each of said plurality of first and second electrodes includes a strip-shaped electrode.

11. A display apparatus providing a touch-sensitive panel according to claim 10, wherein each of said plurality of first and second electrodes is made of a transference electrically conductive material and each is formed to have a thickness of from about 300 angstroms to 1000 angstroms.

12. A touch-sensitive panel according to claim 11, wherein said transference electrically conductive material for said plurality of first and second electrodes comprises Indium Tin Oxide.

13. A display apparatus providing a touch-sensitive panel according to claim 8, wherein said conductive particles are made of carbon particles.

14. A display apparatus providing a touch-sensitive panel according to claim 8, wherein said conductive layer is made of a layer having a viscosity of about 3000 P.S at a temperature of 25° C. and is formed to have a thickness of from about 5 $\mu$m to 20 $\mu$m.

15. A display apparatus providing a touch-sensitive panel according to claim 8, wherein said display device includes a liquid crystal device comprising:

a first glass plate;

a second glass plate being opposed to said first glass plate;

a plurality of first strip electrodes formed on said first glass plate;

a plurality of second strip electrodes formed on one surface of said second glass plate and being opposed to said plurality of first strip electrodes;

a liquid crystal layer injection between said first glass plate and said second glass plate; and sealing members for sealing said liquid crystal layer, and wherein said plurality of second strip electrodes are arranged on the other surface of said second glass plate.

* * * * *